United States Patent
Kocon

(10) Patent No.: US 7,429,523 B2
(45) Date of Patent: Sep. 30, 2008

(54) METHOD OF FORMING SCHOTTKY DIODE WITH CHARGE BALANCE STRUCTURE

(75) Inventor: Christopher Boguslaw Kocon, Plains, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/378,087

(22) Filed: Mar. 17, 2006

(65) Prior Publication Data

US 2006/0166473 A1 Jul. 27, 2006

Related U.S. Application Data

(60) Division of application No. 10/821,796, filed on Apr. 9, 2004, now Pat. No. 7,061,066, which is a continuation-in-part of application No. 10/288,982, filed on Nov. 5, 2002, now Pat. No. 7,132,712, and a continuation-in-part of application No. 10/666,034, filed on Sep. 18, 2003, now Pat. No. 6,991,977, which is a division of application No. 09/981,583, filed on Oct. 17, 2001, now Pat. No. 6,677,641.

(51) Int. Cl.
*H01L 29/72* (2006.01)

(52) U.S. Cl. .................. 438/570; 438/212; 438/268; 438/576; 257/328; 257/476

(58) Field of Classification Search ............ 438/212, 438/268, 570, 576; 257/328, 476
See application file for complete search history.

(56) References Cited

U.S. PATENT DOCUMENTS

| | | | |
|---|---|---|---|
| 3,404,295 A | 10/1968 | Warner et al. | |
| 3,412,297 A | 11/1968 | Amlinger | |
| 3,497,777 A | 2/1970 | Teszner et al. | |
| 3,564,356 A | 2/1971 | Wilson | |
| 3,660,697 A | 5/1972 | Berglund et al. | |
| 4,003,072 A | 1/1977 | Matsushita et al. | |
| 4,011,105 A | 3/1977 | Paivinen et al. | |
| 4,300,150 A | 11/1981 | Colak | |

(Continued)

FOREIGN PATENT DOCUMENTS

CN 1036666 A 10/1989

(Continued)

OTHER PUBLICATIONS

Andreini et al. A New Integrated Silicon Gate Technology Combining Bipolar Linear, CMOS Logic, and DMOS Power Parts, IEEE Transactions on Electron Devices, vol. ED-33, No. 12, Dec. 1986.

(Continued)

*Primary Examiner*—Edward Wojciechowicz
(74) *Attorney, Agent, or Firm*—Townsend and Townsend and Crew LLP

(57) ABSTRACT a Schottky diode having a semiconductor region is formed as follows. A plurality of charge control electrodes are formed in the semiconductor region so as to influence an electric field in the semiconductor region, wherein at least two of the charge control electrodes are adapted to be biased differently from one another. The semiconductor region is overlaid with a metal layer to thereby form a Schottky barrier therebetween.

22 Claims, 11 Drawing Sheets

U.S. PATENT DOCUMENTS

| | | |
|---|---|---|
| 4,324,038 A | 4/1982 | Chang et al. |
| 4,326,332 A | 4/1982 | Kenney et al. |
| 4,337,474 A | 6/1982 | Yukimoto |
| 4,338,616 A | 7/1982 | Bol |
| 4,345,265 A | 8/1982 | Blanchard |
| 4,445,202 A | 4/1984 | Geotze et al. |
| 4,568,958 A | 2/1986 | Baliga |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,673,962 A | 6/1987 | Chatterjee et al. |
| 4,694,313 A | 9/1987 | Beasom |
| 4,698,653 A | 10/1987 | Cardwell, Jr. |
| 4,716,126 A | 12/1987 | Cogan |
| 4,745,079 A | 5/1988 | Pfiester |
| 4,746,630 A | 5/1988 | Hui et al. |
| 4,754,310 A | 6/1988 | Coe |
| 4,767,722 A | 8/1988 | Blanchard |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,824,793 A | 4/1989 | Richardson et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,961,100 A | 10/1990 | Baliga et al. |
| 4,967,245 A | 10/1990 | Cogan et al. |
| 4,969,028 A | 11/1990 | Baliga |
| 4,974,059 A | 11/1990 | Kinzer |
| 4,990,463 A | 2/1991 | Mori |
| 4,992,390 A | 2/1991 | Chang |
| 5,023,196 A | 6/1991 | Johnsen et al. |
| 5,027,180 A | 6/1991 | Nishizawa et al. |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Buluccea |
| 5,079,608 A | 1/1992 | Wodarczyk et al. |
| 5,105,243 A | 4/1992 | Nakagawa et al. |
| 5,111,253 A | 5/1992 | Korman et al. |
| 5,134,448 A | 7/1992 | Johnsen et al. |
| 5,142,640 A | 8/1992 | Iwanatsu |
| 5,156,989 A | 10/1992 | Williams et al. |
| 5,164,325 A | 11/1992 | Cogan et al. |
| 5,164,802 A | 11/1992 | Jones et al. |
| 5,168,331 A | 12/1992 | Yilmaz |
| 5,168,973 A | 12/1992 | Asayama et al. |
| 5,188,973 A | 2/1993 | Omura et al. |
| 5,208,657 A | 5/1993 | Chatterjee et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,242,845 A | 9/1993 | Baba et al. |
| 5,250,450 A | 10/1993 | Lee et al. |
| 5,262,336 A | 11/1993 | Pike, Jr. et al. |
| 5,268,311 A | 12/1993 | Euen et al. |
| 5,270,257 A | 12/1993 | Shin |
| 5,275,961 A | 1/1994 | Smayling et al. |
| 5,275,965 A | 1/1994 | Manning |
| 5,281,548 A | 1/1994 | Prall |
| 5,283,201 A | 2/1994 | Tsang et al. |
| 5,283,452 A | 2/1994 | Shih et al. |
| 5,294,824 A | 3/1994 | Okada |
| 5,298,781 A | 3/1994 | Cogan et al. |
| 5,300,447 A | 4/1994 | Anderson |
| 5,300,452 A | 4/1994 | Chang et al. |
| 5,326,711 A | 7/1994 | Malhi |
| 5,346,834 A | 9/1994 | Hisamoto et al. |
| 5,349,224 A | 9/1994 | Gilbert et al. |
| 5,350,937 A | 9/1994 | Yamazaki et al. |
| 5,365,102 A | 11/1994 | Mehrotra et al. |
| 5,366,914 A | 11/1994 | Takahashi et al. |
| 5,378,655 A | 1/1995 | Hutchings et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,007 A | 8/1995 | Vinal et al. |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,488,010 A | 1/1996 | Wong |
| 5,519,245 A | 5/1996 | Tokura et al. |
| 5,532,179 A | 7/1996 | Chang et al. |
| 5,541,425 A | 7/1996 | Nishihara |
| 5,554,552 A | 9/1996 | Chi |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,060 A | 12/1996 | Hertrich et al. |
| 5,583,065 A | 12/1996 | Miwa |
| 5,592,005 A | 1/1997 | Floyd et al. |
| 5,593,909 A | 1/1997 | Han et al. |
| 5,595,927 A | 1/1997 | Chen et al. |
| 5,597,765 A | 1/1997 | Yilmaz et al. |
| 5,605,852 A | 2/1997 | Bencuya |
| 5,614,749 A | 3/1997 | Ueno |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,283 A | 7/1997 | Tsang et al. |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,684,320 A | 11/1997 | Kawashima |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,717,237 A | 2/1998 | Chi |
| 5,719,409 A | 2/1998 | Singh et al. |
| 5,721,148 A | 2/1998 | Nishimura |
| 5,744,372 A | 4/1998 | Bulucea |
| 5,767,004 A | 6/1998 | Balasubramanian et al. |
| 5,770,878 A | 6/1998 | Beasom |
| 5,776,813 A | 7/1998 | Huang et al. |
| 5,780,343 A | 7/1998 | Bashir |
| 5,801,082 A | 9/1998 | Tseng |
| 5,801,417 A | 9/1998 | Tsang et al. |
| 5,814,858 A | 9/1998 | Williams |
| 5,821,583 A | 10/1998 | Hshieh et al. |
| 5,877,528 A | 3/1999 | So |
| 5,879,971 A | 3/1999 | Witek |

| | | | | | | |
|---|---|---|---|---|---|---|
| 5,879,994 | A | 3/1999 | Kwan et al. | 6,174,773 B1 | 1/2001 | Fujishima |
| 5,891,776 | A | 4/1999 | Han et al. | 6,174,785 B1 | 1/2001 | Parekh et al. |
| 5,894,157 | A | 4/1999 | Han et al. | 6,184,092 B1 | 2/2001 | Tseng et al. |
| 5,895,951 | A | 4/1999 | So et al. | 6,184,545 B1 | 2/2001 | Werner et al. |
| 5,895,952 | A | 4/1999 | Darwish et al. | 6,184,555 B1 | 2/2001 | Tihanyi et al. |
| 5,897,343 | A | 4/1999 | Mathew et al. | 6,188,104 B1 | 2/2001 | Choi et al. |
| 5,897,360 | A | 4/1999 | Kawaguchi | 6,188,105 B1 | 2/2001 | Kocon et al. |
| 5,900,663 | A | 5/1999 | Johnson et al. | 6,190,978 B1 | 2/2001 | D'Anna |
| 5,906,680 | A | 5/1999 | Meyerson | 6,191,447 B1 | 2/2001 | Baliga |
| 5,907,776 | A | 5/1999 | Hshieh et al. | 6,194,741 B1 | 2/2001 | Kinzer et al. |
| 5,917,216 | A | 6/1999 | Floyd et al. | 6,198,127 B1 | 3/2001 | Kocon |
| 5,929,481 | A | 7/1999 | Hsieh et al. | 6,201,279 B1 | 3/2001 | Pfirsch |
| 5,943,581 | A | 8/1999 | Lu et al. | 6,204,097 B1 | 3/2001 | Shen et al. |
| 5,945,708 | A | 8/1999 | Tihanyi | 6,207,994 B1 | 3/2001 | Rumennik et al. |
| 5,949,104 | A | 9/1999 | D'Anna et al. | 6,222,229 B1 | 4/2001 | Hebert et al. |
| 5,949,124 | A | 9/1999 | Hadizad et al. | 6,222,233 B1 | 4/2001 | D'Anna |
| 5,959,324 | A | 9/1999 | Kohyama | 6,225,649 B1 | 5/2001 | Minato |
| 5,960,271 | A | 9/1999 | Wollesen et al. | 6,228,727 B1 | 5/2001 | Lim et al. |
| 5,960,311 | A | 9/1999 | Singh et al. | 6,229,194 B1 | 5/2001 | Lizotte |
| 5,972,741 | A | 10/1999 | Kubo et al. | 6,239,463 B1 | 5/2001 | Williams et al. |
| 5,973,360 | A | 10/1999 | Tihanyi | 6,239,464 B1 | 5/2001 | Tsuchitani et al. |
| 5,973,367 | A | 10/1999 | Williams | 6,246,090 B1 | 6/2001 | Brush et al. |
| 5,976,936 | A | 11/1999 | Miyajima et al. | 6,262,453 B1 | 7/2001 | Hsieh |
| 5,977,591 | A | 11/1999 | Fratin et al. | 6,265,269 B1 | 7/2001 | Chen et al. |
| 5,981,344 | A | 11/1999 | Hshieh et al. | 6,271,082 B1 | 8/2001 | Hou et al. |
| 5,981,354 | A | 11/1999 | Spikes et al. | 6,271,100 B1 | 8/2001 | Ballantine et al. |
| 5,981,996 | A | 11/1999 | Fujishima | 6,271,552 B1 | 8/2001 | D'Anna |
| 5,998,833 | A | 12/1999 | Baliga | 6,271,562 B1 | 8/2001 | Deboy et al. |
| 6,005,271 | A | 12/1999 | Hshieh | 6,274,437 B1 | 8/2001 | Evans |
| 6,008,097 | A | 12/1999 | Yoon et al. | 6,274,904 B1 | 8/2001 | Tihanyi |
| 6,008,520 | A | 12/1999 | Darwish et al. | 6,274,905 B1 | 8/2001 | Mo |
| 6,011,298 | A | 1/2000 | Blanchard | 6,277,706 B1 | 8/2001 | Ishikawa |
| 6,015,727 | A | 1/2000 | Wanlass | 6,281,547 B1 | 8/2001 | So et al. |
| 6,020,250 | A | 2/2000 | Kenny et al. | 6,285,060 B1 | 9/2001 | Korec et al. |
| 6,034,415 | A | 3/2000 | Johnson et al. | 6,291,298 B1 | 9/2001 | Williams et al. |
| 6,037,202 | A | 3/2000 | Witek | 6,291,856 B1 | 9/2001 | Miyasaka et al. |
| 6,037,628 | A | 3/2000 | Huang | 6,294,818 B1 | 9/2001 | Fujihira |
| 6,037,632 | A | 3/2000 | Omura et al. | 6,297,534 B1 | 10/2001 | Kawaguchi et al. |
| 6,037,633 | A | 3/2000 | Shinohara | 6,303,969 B1 | 10/2001 | Tan |
| 6,040,600 | A | 3/2000 | Uenishi et al. | 6,307,246 B1 | 10/2001 | Nitta et al. |
| 6,048,772 | A | 4/2000 | D'Anna | 6,309,920 B1 | 10/2001 | Laska et al. |
| 6,049,108 | A | 4/2000 | Williams et al. | 6,313,482 B1 | 11/2001 | Baliga |
| 6,051,488 | A | 4/2000 | Lee et al. | 6,316,806 B1 | 11/2001 | Mo |
| 6,057,558 | A | 5/2000 | Yamamoto et al. | 6,326,656 B1 | 12/2001 | Tihanyi |
| 6,063,678 | A | 5/2000 | D'Anna | 6,337,499 B1 | 1/2002 | Werner |
| 6,064,088 | A | 5/2000 | D'Anna | 6,346,464 B1 | 2/2002 | Takeda et al. |
| 6,066,878 | A | 5/2000 | Neilson | 6,346,469 B1 | 2/2002 | Greer |
| 6,069,043 | A | 5/2000 | Floyd et al. | 6,351,018 B1 | 2/2002 | Sapp |
| 6,072,215 | A | 6/2000 | Kawaji et al. | 6,353,252 B1 | 3/2002 | Yasuhara et al. |
| 6,077,733 | A | 6/2000 | Chen et al. | 6,359,308 B1 | 3/2002 | Hijzen et al. |
| 6,081,009 | A | 6/2000 | Neilson | 6,362,112 B1 | 3/2002 | Hamerski |
| 6,084,264 | A | 7/2000 | Darwish | 6,362,505 B1 | 3/2002 | Tihanyi |
| 6,084,268 | A | 7/2000 | de Frésart et al. | 6,365,462 B2 | 4/2002 | Baliga |
| 6,087,232 | A | 7/2000 | Kim et al. | 6,365,930 B1 | 4/2002 | Schillaci et al. |
| 6,096,608 | A | 8/2000 | Williams | 6,368,920 B1 | 4/2002 | Beasom |
| 6,097,063 | A | 8/2000 | Fujihira | 6,368,921 B1 | 4/2002 | Hijzen et al. |
| 6,103,578 | A | 8/2000 | Uenishi et al. | 6,373,097 B1 | 4/2002 | Werner |
| 6,103,619 | A | 8/2000 | Lai | 6,373,098 B1 | 4/2002 | Brush et al. |
| 6,104,054 | A | 8/2000 | Corsi et al. | 6,376,314 B1 | 4/2002 | Jerred |
| 6,110,799 | A | 8/2000 | Huang | 6,376,315 B1 | 4/2002 | Hshieh et al. |
| 6,114,727 | A | 9/2000 | Ogura et al. | 6,376,878 B1 | 4/2002 | Kocon |
| 6,121,089 | A | 9/2000 | Zeng et al. | 6,376,890 B1 | 4/2002 | Tihanyi |
| 6,137,152 | A | 10/2000 | Wu | 6,384,456 B1 | 5/2002 | Tihanyi |
| 6,140,678 | A | 10/2000 | Grabowski et al. | 6,388,286 B1 | 5/2002 | Baliga |
| 6,150,697 | A | 11/2000 | Teshigahara et al. | 6,388,287 B2 | 5/2002 | Deboy et al. |
| 6,156,606 | A | 12/2000 | Michaelis | 6,392,290 B1 | 5/2002 | Kasem et al. |
| 6,156,611 | A | 12/2000 | Lan et al. | 6,396,102 B1 | 5/2002 | Calafut |
| 6,163,052 | A | 12/2000 | Liu et al. | 6,400,003 B1 | 6/2002 | Huang |
| 6,165,870 | A | 12/2000 | Shim et al. | 6,413,822 B2 | 7/2002 | Williams et al. |
| 6,168,983 | B1 | 1/2001 | Rumennik et al. | 6,426,260 B1 | 7/2002 | Hshieh |
| 6,168,996 | B1 | 1/2001 | Numazawa et al. | 6,429,481 B1 | 8/2002 | Mo et al. |
| 6,171,935 | B1 | 1/2001 | Nance et al. | 6,433,385 B1 | 8/2002 | Kocon et al. |
| 6,174,769 | B1 | 1/2001 | Lou | 6,436,779 B2 | 8/2002 | Hurkx et al. |

| | | |
|---|---|---|
| 6,437,399 B1 | 8/2002 | Huang |
| 6,441,454 B2 | 8/2002 | Hijzen et al. |
| 6,444,527 B2 | 9/2002 | Floyd et al. |
| 6,444,574 B1 | 9/2002 | Chu |
| 6,452,230 B1 | 9/2002 | Boden, Jr. |
| 6,455,379 B2 | 9/2002 | Brush et al. |
| 6,459,122 B2 | 10/2002 | Uno |
| 6,461,918 B1 | 10/2002 | Calafut |
| 6,465,304 B1 | 10/2002 | Blanchard et al. |
| 6,465,843 B1 | 10/2002 | Hirler et al. |
| 6,465,869 B2 | 10/2002 | Ahlers et al. |
| 6,472,678 B1 | 10/2002 | Hshieh et al. |
| 6,472,708 B1 | 10/2002 | Hshieh et al. |
| 6,475,884 B2 | 11/2002 | Hshieh et al. |
| 6,476,443 B1 | 11/2002 | Kinzer |
| 6,479,352 B2 | 11/2002 | Blanchard |
| 6,489,652 B1 | 12/2002 | Jeon et al. |
| 6,501,146 B1 | 12/2002 | Harada |
| 6,509,240 B2 | 1/2003 | Ren et al. |
| 6,518,127 B2 | 2/2003 | Hsieh et al. |
| 6,521,497 B2 | 2/2003 | Mo |
| 6,534,825 B2 | 3/2003 | Calafut |
| 6,566,804 B1 | 5/2003 | Trujillo et al. |
| 6,580,123 B2 | 6/2003 | Thapar |
| 6,583,010 B2 | 6/2003 | Mo |
| 6,600,194 B2 | 7/2003 | Hueting et al. |
| 6,608,350 B2 | 8/2003 | Kinzer et al. |
| 6,621,107 B2 | 9/2003 | Blanchard et al. |
| 6,627,949 B2 | 9/2003 | Blanchard |
| 6,635,534 B2 | 10/2003 | Madson |
| 6,657,254 B2 | 12/2003 | Hshieh et al. |
| 6,677,641 B2 | 1/2004 | Kocon |
| 6,677,643 B2 | 1/2004 | Iwamoto et al. |
| 6,683,346 B2 | 1/2004 | Zeng |
| 6,689,662 B2 | 2/2004 | Blanchard |
| 6,710,402 B2 | 3/2004 | Harada |
| 6,710,406 B2 | 3/2004 | Mo et al. |
| 6,713,813 B2 | 3/2004 | Marchant |
| 6,720,616 B2 | 4/2004 | Hirler et al. |
| 6,724,042 B2 | 4/2004 | Onishi et al. |
| 6,734,066 B2 | 5/2004 | Lin et al. |
| 6,750,508 B2 | 6/2004 | Omura et al. |
| 6,756,636 B2 | 6/2004 | Onishi et al. |
| 6,762,127 B2 | 7/2004 | Boiteux et al. |
| 6,781,195 B2 | 8/2004 | Wu et al. |
| 6,806,533 B2 | 10/2004 | Henninger et al. |
| 6,821,824 B2 | 11/2004 | Minato et al. |
| 6,833,584 B2 | 12/2004 | Henninger et al. |
| 6,833,585 B2 | 12/2004 | Kim |
| 6,878,994 B2 | 4/2005 | Thapar |
| 6,892,098 B2 | 5/2005 | Ayal et al. |
| 6,921,939 B2 | 7/2005 | Zeng |
| 7,005,351 B2 | 2/2006 | Henninger et al. |
| 7,033,876 B2 | 4/2006 | Darwish et al. |
| 7,091,573 B2 | 8/2006 | Hirler et al. |
| 2002/0038886 A1 | 4/2002 | Mo |
| 2003/0060013 A1 | 3/2003 | Marchant et al. |
| 2003/0207538 A1* | 11/2003 | Hshieh et al. ............... 438/269 |
| 2003/0235936 A1 | 12/2003 | Snyder et al. |
| 2004/0232407 A1 | 11/2004 | Calafut |
| 2005/0017293 A1 | 1/2005 | Zundel et al. |
| 2005/0048701 A1* | 3/2005 | Minato et al. ............... 438/135 |

FOREIGN PATENT DOCUMENTS

| | | |
|---|---|---|
| DE | 4300806 C1 | 12/1993 |
| DE | 19736981 A1 | 8/1998 |
| DE | 102414160 | 10/2003 |
| DE | 102004057235 | 6/2006 |
| EP | 133642 | 3/1985 |
| EP | 288739 | 11/1988 |
| EP | 292782 | 11/1988 |
| EP | 975024 A2 | 1/2000 |
| EP | 1026749 A1 | 8/2000 |
| EP | 1054451 A2 | 11/2000 |
| EP | 747967 B1 | 2/2002 |
| EP | 1205980 A1 | 5/2002 |
| JP | 56-058267 A | 5/1981 |
| JP | 62-069562 | 3/1987 |
| JP | 63-186475 | 8/1988 |
| JP | 63-288047 | 11/1988 |
| JP | 64-022051 | 1/1989 |
| JP | 01-192174 A | 8/1989 |
| JP | 05-226638 A | 9/1993 |
| JP | 2000-040822 | 2/2000 |
| JP | 2000-040872 | 2/2000 |
| JP | 2000-156978 A | 6/2000 |
| JP | 2000-277726 A | 10/2000 |
| JP | 2000-277728 A | 10/2000 |
| JP | 2001-015448 | 1/2001 |
| JP | 2001-015752 | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-244461 A | 9/2001 |
| JP | 2001-313391 A | 12/2001 |
| JP | 2002-083976 A | 3/2002 |
| WO | WO 00/33386 A2 | 6/2000 |
| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 | 9/2001 |
| WO | WO 01/95385 A1 | 12/2001 |
| WO | WO 01/95398 A1 | 12/2001 |
| WO | WO 02/01644 A2 | 1/2002 |
| WO | WO 02/047171 A1 | 6/2002 |

OTHER PUBLICATIONS

Bai et al., "Novel automated optimization of power MOSFET for 12V input, high-frequency DC-DC converter," *International Symposium on Power Semiconductors and ICs, Technical Digest*, (2003), pp. 366-369.

Baliga "New Concepts in Power Rectifiers," Physics of Semiconductor Devices, Proceedings of the Third Int'l Workshop, Madras (India), Committee on Science and Technology in Developing Countries (1985), pp. 471-481.

Baliga "Options for CVD of Dielectrics Include Low-k Materials," Technical Literature from Semiconductor International, Jun. 1998, 4 pages total.

Baliga et al., "Improving the reverse recovery of power MOSFET integral diodes by electron irradiation," (Dec. 1983) *Solid State Electronics*, vol. 26, No. 12, pp. 1133-1141.

Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275-278.

Bulucea "Trench DMOS Transistor Technology For High Current (100 A Range) Switching" Solid-State Electronics vol. 34 No. pp. 493-507 (1991).

Chang et al. "Numerical and experimental Analysis of 500-V Power DMOSFET with an Atomic-Lattice Layout," IEEE Transactions on Electron Devices 36:2623 (1989).

Chang et al. "Self-Aligned UMOSFET's with a Specific On-Resistance of 1mΩ cm$^2$," IEEE Transactions on Electron Devices 34:2329-2334 (1987).

Cheng et al., "Fast reverse recovery body diode in high-voltage VDMOSFET using cell-distributed schottky contacts," (May 2003) *IEEE Transactions on Electron Devices*, vol. 50, No. 5, pp. 1422-1425.

"CoolMOS☐ the second generation," Infineon Technologies product information, (2000), 2 pages total.

Curtis, et al. "APCVD TEOS: 03 Advanced Trench Isolation Applications," Semiconductor Fabtech 9th Edition (1999) 8 pages total.

Darwish et al. A New Power W-Gated Trench MOSFET (WMOSFET) with High Switching Performance. ISPSD Proceedings—Apr. 2003, Cambridge, 4 pages total.

Djekic, O. et al., "High frequency synchronous buck converter for low voltage applications," (1998) *Proc. IEEE Power Electronics Specialist Conf.* (PESC), pp. 1248-1254.

Fujihira "Theory of Semiconductor Superjunction Devices" Jpn. J. Appl. Phys. vol. 36 pp. 6254-6262 (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada (2001), 4 pages total.

Glenn et al. "A Novel Vertical Deep Trench RESURF DMOS (VTR-DMOS)" IEEE ISPD 2000, May 22-25, Toulouse France, pp. 197-200.

Heyes, "Wafer-Scale Processing for Power Discrete Products" Philips Semiconductors BI Power Products.

"IR develops CoolMOS☐ -equivalent technology, positions it at the top of a 3-tiered line of new products for SMPS," International Rectifiers company information available at http://www.irf.com (1999) 3 pages total.

Kao et al. "Two Dimensional Thermal Oxidation of Silicon-I. Experiments,", *IEEE Transactions on Electron Devices*, vol. ED-34, No. 5, May 1987, pp. 1008-1017.

Kao et al. "Two Dimensional Thermal Oxidation of Silicon-II. Modeling Stress Effects in Wet Oxides," *IEEE Transactions on Electron Devices*, vol. ED-35, No. 1, Jan. 1988, pp. 25-37.

Kassakian, J.G. et al., "High-frequency high-density converters for distributed power supply systems," (Apr. 1988) *Proceedings of the IEEE*, vol. 76, No. 4, pp. 362-376.

Korman, C.S. et al., "High performance power DMOSFET with integrated schottky diode," (1989) *Proc. IEEE Power Electronics Specialist Conf.* (PESC), pp. 176-179.

Lorenz et al., "COOL MOS—An important milestone towards a new power MOSFET generation" Power Conversion pp. 151-160 (1988).

Maksimovic, A.M. et al., "Modeling and simulation of power electronic converters," (Jun. 2001) *Proceedings of the IEEE*, vol. 89, No. 6, pp. 898-912.

Mehrotra, M. et al., "Very low forward drop JBS rectifiers fabricated using submicron technology," (Nov. 1993) *IEEE Transactions on Electron Devices*, vol. 40, No. 11, pp. 2131-2132.

Miller, "Power Management & Supply—Market, Applications Technologies—an Overview," Infineon Technologies, downloaded from the internet <<http://www.ewh.ieee.org/r8/germany/ias-pels/m_regensburg/overview$_{13}$miller.pdf>>, May 5, 2003, 53 pages total.

Mirchandani et al. A Novel N-Channel MOSFET Featuring an Integrated Schottky and No Internal P-N Junction Power Semiconductor Devices and ICs, 2004. Proceedings. ISPSD '04. The 16th International Symposium on May 24-27, 2004, pp. 405-408.

Moghadam "Delivering Value Around New Industry Paradigms," Technical Literature from Applied Materials, pp. 1-11, vol. 1, Issue 2, Nov. 1999.

Park et al., "Lateral Trench Gate Super-Junction SOI-LDMOSFETs with Low On-Resistance," Institute for Microelectronics, University of Technology Vienna, Austria (2002), pp. 283-285.

Sakai et al., "Experimental investigation of dependence of electrical characteristics of device parameters in trench MOS barrier, schottky diodes," (1998) *International Symposium on Power Semiconductors and ICs, Technical Digest*, pp. 293-296.

Shenai et al., "Current transport mechanisms in atomically abrupt metal-semiconductor interfaces," (Apr. 1988) *IEEE Transactions on Electron Devices*, vol. 35, No. 4, pp. 468-482.

Shenai et al., "Monolithically integrated power MOSFET and schottky diode with improved reverse recovery characteristics," (Apr. 1990) *IEEE Transactions on Electron Devices*, vol. 37, No. 4, pp. 1167-1169.

Shenoy et al. "Analysis of the Effect of Charge Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Tabisz et al., "A MOSFET resonant synchronous rectifier for high-frequency dc/dc converters," (1990) *Proc. IEEE Power Electronics Specialist Conf.* (PESC), pp. 769-779.

Technical Literature from Quester Technology, Model APT-4300 300mm Atmospheric TEOS/Ozone CVD System, (unknown date), 3 pages total.

Technical Literature from Quester Technology, Model APT-6000 Atmospheric TEOS-Ozone CVD System, (unknown date), 2 pages total.

Technical Literature from Silicon Valley Group Thermal Systems, APNext, High Throughput APCVD Cluster Tool for 200 mm/300 mm Wafer Processing, (unknown date), 2 pages total.

Tu et al. "On the reverse blocking characteristics of schottky power diodes," (Dec. 1992) *IEEE Transactions on Electron Devices*. vol. 39, No. 12, pp. 2813-2814 2 pages total.

Ueda et al. "Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf et al., "Silicon Processing for The VLSI Era" vol. 1—Process Technology, Second Edition, (1990), pp. 658.

Wolf, "Silicon Processing for The VLSI Era" vol. 2 Process Integration Lattice Press (1990), 3 pages total.

Yamashita et al., Conduction Power loss in MOSFET synchronous rectifier with parallel-connected schottky barrier diode, (Jul. 1998) *IEEE Transactions on Power electronics*, vol. 13, No. 4, pp. 667-673.

Zeng "An Improved Power MOSFET Using a Novel Split Well Structure". Harris Corporation, Semiconductor Section, Technical Publication, 4 pages.

Zeng et al. An Ultra Dense Trench-Gated Power MOSFET Technology Using a Self-Aligned Process, Intersil Corporation, Technical Publication, 4 pages.

\* cited by examiner

METHOD OF FORMING SCHOTTKY DIODE WITH CHARGE BALANCE STRUCTURE

CROSS-REFERENCES TO RELATED APPLICATIONS

This application is a division of U.S. application Ser. No. 10/821,796, filed Apr. 9, 2004 now U.S. Pat. No. 7,061,066, which is a continuation-in-part of (1) U.S. application Ser. No. 10/288,982, filed Nov. 5, 2002 now U.S. Pat. No. 7,132,712, and (2) U.S. application Ser. No. 10/666,034, filed Sep. 18, 2003, now U.S. Pat. No. 6,991,977, which is a division of U.S. application Ser. No. 09/981,583, filed Oct. 17, 2001, now U.S. Pat. No. 6,677,641, which disclosures are incorporated herein by reference in their entirety for all purposes.

BACKGROUND OF THE INVENTION

The present invention relates in general to semiconductor technology and in particular to Schottky diode structures and methods of manufacturing the same.

Schottky diodes are semiconductor devices which have a metal-semiconductor transition as their basic structure and whose basic electronic properties are defined by this transition. A Schottky diode is formed from a metal-semiconductor combination which is chosen such that a depletion zone arises at the boundary surface.

FIG. 1 shows a cross-section view of a portion of a conventional Schottky diode. Schottky diode 100 is formed by a metal layer 102 contacting a semiconductor region 104. When Schottky diode 100 is turned on, current travels in a vertical direction from the metal layer 102 to the semiconductor region 104. In such devices, the electric field decreases linearly from its maximum at the metal-semiconductor boundary surface, or Schottky barrier, through the semiconductor region 104 at a rate dictated by the doping concentration of the semiconductor region 104. In addition, the semiconductor region 104 doping and thickness is tailored for a given blocking voltage, or breakdown voltage.

However, in the mid to high voltage range (e.g., 60 to 2000 volts), conventional Schottky diodes suffer from power loss primarily due to the high resistivity of the semiconductor region (e.g., semiconductor region 104 in FIG. 1). The semiconductor region has high resistivity because in order for the device to sustain the high voltages during the blocking state, the semiconductor region is lightly doped. The high resistivity of the semiconductor region results in a higher on-resistance, which in turn results in high power loss. Since a high blocking voltage is a critical feature for mid to high voltage power devices, increasing the semiconductor region doping is not an option.

Thus, a technique which enables achieving a high device blocking capability, low on-resistance, and high current handling capability is desirable.

BRIEF SUMMARY OF THE INVENTION

In accordance with an embodiment of the invention, a Schottky diode having a semiconductor region is formed as follows. A plurality of charge control electrodes are formed in the semiconductor region so as to influence an electric field in the semiconductor region, wherein at least two of the charge control electrodes are adapted to be biased differently from one another. The semiconductor region is overlaid with a metal layer to thereby form a Schottky barrier therebetween.

In one embodiment, a plurality of trenches are formed in the semiconductor region, and the plurality of charge control electrodes are formed in the semiconductor region as follow. Each of the plurality of trenches is lined with an insulating layer. A first conductive material is deposited in each trench and then etched to form a first charge control electrodes in each trench. A first insulating layer is formed over each of the first charge control electrodes. A second conductive material is deposited in each trench and then etched to form a second charge control electrode in each trench over the first insulating layer.

In one embodiment, a plurality of biasing elements are formed on or in the semiconductor region, wherein the biasing elements are adapted to bias the at least two charge control electrodes at different voltages.

In accordance with another embodiment of the invention, a Schottky diode is formed as follows. A first trench extending in a semiconductor region is formed. At least one diode is formed in the first trench. The semiconductor region is overlaid with a metal layer to thereby form a Schottky barrier therebetween.

In one embodiment, an insulating layer is formed which extends along sidewalls of the first trench but is discontinuous along the bottom of the first trench.

In another embodiment, the at least one diode is arranged in the first trench so that when the Schottky diode is biased in a blocking state an electric field induced in the at least one diode influences an electric field in the semiconductor region to thereby increase the blocking voltage of the Schottky diode.

In yet another embodiment, the at least one diode is formed by forming n-type and p-type regions alternately stacked on top of one another in the first trench.

In yet another embodiment, a plurality of shallow regions are formed in a top surface region of the semiconductor region between adjacent pairs of the plurality of trenches such that the metal layer is in direct contact with the shallow regions to form a Schottky barrier therebetween. The shallow layer has the same conductivity type as but a lower doping concentration than that of the semiconductor region.

In accordance with yet another embodiment of the invention, a Schottky diode is formed as follows. A plurality of laterally spaced trenches are formed in a semiconductor region, wherein each trench extends through at least a portion of the semiconductor region. A plurality of diodes are formed in each of the plurality of trenches. The semiconductor region is overlaid with a metal layer so as to form a Schottky barrier therebetween.

In one embodiment, the plurality of diodes are formed in each of the plurality of trenches such that an electric field induced in one or more of the plurality of diodes influences an electric field in the semiconductor region such that a blocking voltage of the Schottky diode is increased.

These and other embodiments of the invention will be described with reference to the accompanying drawings and following detailed description.

DETAILED DESCRIPTION OF THE INVENTION

Figure 1:
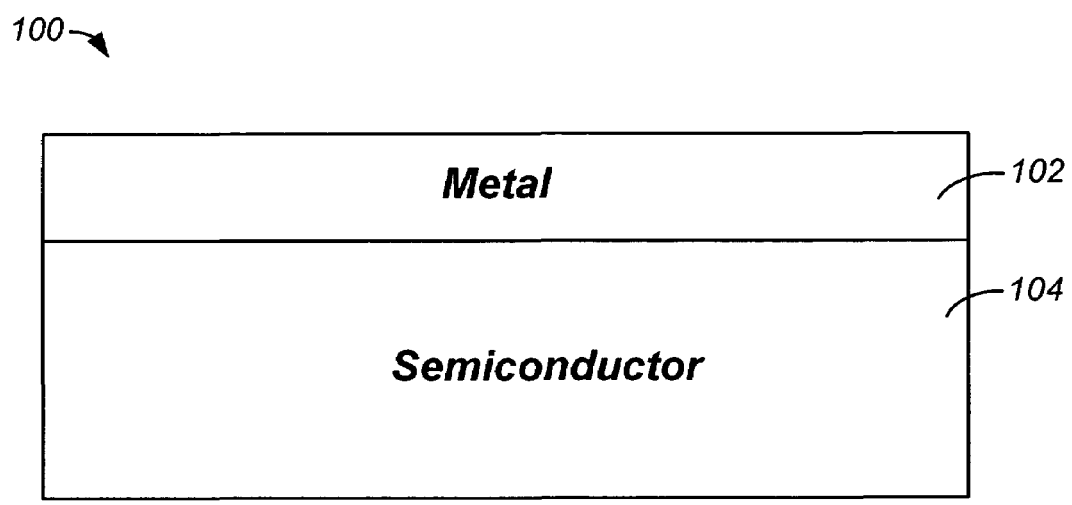
FIG. 1 shows a cross-section view of a conventional Schottky diode.

Embodiments of the invention are directed to semiconductor devices and in particular to Schottky diode structures and methods of manufacturing the same.

Schottky diodes comprise a metal layer, such as Titanium, Platinum, Gold, Chromium, Palladium, Nickel, and a semiconductor region, such as Silicon, Gallium Arsenide, Silicon Carbide, or Gallium Nitride. The junction between the metal layer and the semiconductor region forms a Schottky barrier.

In embodiments of the invention, the Schottky diode includes one or more charge control electrodes. The charge control electrodes may be biased to control the electric field within the semiconductor region. In some embodiments, these charge control electrodes may be referred to as "field plates". The spacing and arrangement of the charge control electrodes can be set up in various stripe or cellular designs. In some embodiments, the sidewalls of each charge control electrode may be substantially parallel.

The charge control electrodes are stacked and buried within the semiconductor region. The stack of charge control electrodes is oriented generally vertically with respect to the major surface of the semiconductor region. A dielectric material insulates each of the charge control electrodes from the semiconductor region.

In some embodiments of the invention, there may be one or a more charge control electrodes. The charge control electrodes can be arranged in a plurality of groups with each group being embedded in a separate dielectric material structure. These different groups of charge control electrodes can be located at any suitable place in the semiconductor device. For example, the different pluralities of stacked charge control electrodes can be disposed at the center of the semiconductor region, and/or to the side of the semiconductor region. The different pluralities of charge control electrodes can function independently of each other or together to alter the electric field within the semiconductor region.

In one embodiment, each charge control electrode in one group of charge control electrodes is adapted to be biased differently than the other charge control electrodes in the same group of charge control electrodes. The differently biased charge control electrodes can be used to adjust the electric field within the semiconductor region. When a Schottky diode, according to an embodiment of the invention, is in a blocking state, for example, the charge control electrodes within a group of charge control electrodes can be differently biased to maintain a substantially uniform and high electric field within the semiconductor region. By maintaining a substantially uniform electric field within the semiconductor region, the breakdown voltage of the semiconductor device is increased. Thus, for the same breakdown voltage, the semiconductor region can be highly doped to reduce the on-resistance. Accordingly, in embodiments of the invention, semiconductor devices having high breakdown voltages and/or low on-resistance properties can be produced.

In yet other embodiments, a Schottky diode structure has a trench with one or more diodes embedded therein (referred to hereinafter as "the diode trench structure"). Much like the charge control electrodes, the one or more embedded diodes advantageously influence the electric field within the semiconductor region to improve the breakdown voltage. The diode trench structure may be integrated in Schottky diode devices required to withstand high voltages. The diode trench structure helps achieve high breakdown voltages and/or low on-resistance properties.

Embodiments of the invention have a number of advantages over conventional Schottky diodes. In embodiments of the invention, the charge control electrodes or embedded diodes are used for charge spreading in the semiconductor region. For example, in the case of charge control electrodes, the bias of the charge control electrodes can be set precisely to control charge spreading in the semiconductor region of a device. Consequently, the maximum electric field in the semiconductor substrate can be much greater than about $2 \times 10^5$ V/cm, the maximum practical electric field achievable by superjunction devices. In some embodiments of the invention, the maximum electric field that can be created in the semiconductor region is limited by the ability of the dielectric material surrounding the charge control electrodes to support the voltages of the charge control electrodes. The maximum electric field achievable in some embodiments of the invention can easily exceed $3.5 \times 10^5$ V/cm, a value greater than the electric field achievable in superjunction devices. Another advantage of the proposed structures is the relative ease of making narrow charge distribution regions in the semiconductor region. This improves the usage and efficiency of the semiconductor region. Furthermore, in embodiments of the invention, the Schottky diodes can have breakdown ratings in the low to mid voltage ranges, while exhibiting low on-resistance. For example, for a 150V Schottky diode, the on-resistance per unit area of some embodiments of the invention has been simulated to be 50% less than the on-resistance per unit area of conventional 150V Schottky diodes. While superjunction devices have low on-resistance properties, the precise doping requirements of superjunction devices have prevented them from being made with breakdown voltage ratings in lower to mid voltage ranges (e.g., <200 V).

Using differently biased charge control electrodes or reverse biased trench diode structures in the semiconductor region of the Schottky diode substantially "flattens" out the electric field profile across the semiconductor region. If the charge control electrodes or trench diode structures are not present, the electric field profile would be "triangular" across the semiconductor region. In a conventional device, the electric field is at a maximum at the Schottky barrier junction and then decreases linearly from the Schottky barrier junction into the depth of the semiconductor region. By causing the electric field profile to be flatter (i.e., more uniform) across the semiconductor region of a semiconductor device, a higher breakdown voltage is obtained. As will be shown, by using multiple charge control electrodes in each trench or multiple diodes in each trench, multiple spikes are induced in the electric filed profile along the depth of the semiconductor region. This increase in the electric field results in a larger area under the electric field curve, which in turn results in a higher breakdown voltage. In general, the use of more charge control electrodes or more diodes in each trench in the semiconductor region can result in a more uniform electric field in the semiconductor region.

Figure 2:
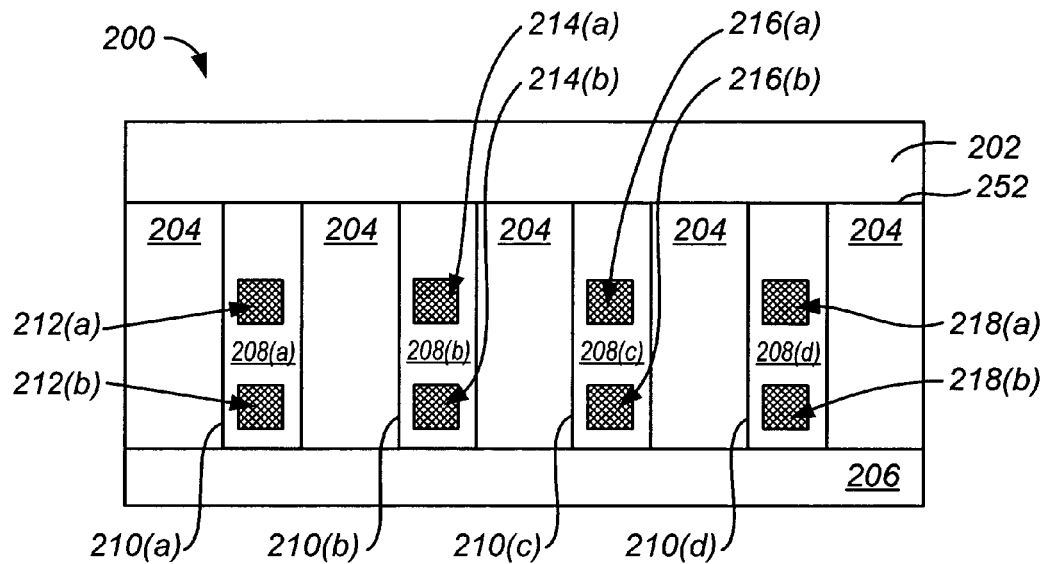
FIG. 2 shows a cross-section view of a Schottky diode structure having trenches with charge control electrodes therein in accordance with an embodiment of the present invention.

FIG. 2 shows a cross-sectional view of a Schottky diode structure 200 having a plurality of trenches 210(a)-210(d) in accordance with one embodiment of the invention. A semiconductor region 204 (e.g., an epitaxial layer) is formed over and is of the same conductivity type as a substrate 206. A metal layer 202 overlies semiconductor region 204 to form a Schottky barrier therebetween. The plurality of trenches 210(a)-210(d) extends from a top surface of semiconductor region 204 through to substrate 206. Trenches 210(a)-210(d) may alternatively be terminated at a shallower depth or could extend deeper into substrate 206.

A first plurality of charge control electrodes 212(a)-212(b), a second plurality of charge control electrodes 214(a)-214(b), a third plurality of charge control electrodes 216(a)-216(b), and a fourth plurality of charge control electrodes 218(a)-218(b) are respectively disposed in first, second, third, and fourth trenches 210(a)-210(d). The charge control electrodes within a common trench are shown in a stacked relationship. The charge control electrodes are separated from each other and from the semiconductor region 204 by the dielectric material 208(a)-208(d) within each of trenches 210(a)-210(d). Dielectric material 208(a)-208(d) may comprise one or more of, for example, silicon dioxide, silicon nitride, and glass. Charge control electrodes within different pluralities of charge control electrodes can be at about the same vertical distance from the major surface 252. For example, charge electrodes 212(a), 214(a), 216(a), and 218(a) may be at the same vertical position within the semiconductor region 204.

Although the exemplary embodiment shown in FIG. 2 shows four trenches 210(a)-210(d), it is understood that any suitable number of trenches, and typically a large number of trenches, are present in the Schottky diode structure. Each charge control electrode may be formed of any suitable material, such as doped or undoped polysilicon, or metal. Although two charge control electrodes are shown in each of the trenches 210(a)-210(d) in the embodiment illustrated in FIG. 2, it is to be understood that any suitable number of charge control electrodes can be present in each trench. In general, a more uniform electric field can be obtained in semiconductor region 204 if there are more charge control electrodes per stack of charge control electrodes. This is described in more detail further below.

Each of charge control electrodes 212(a)-212(b), 214(a)-214(b), 216(a)-216(b), 218(a)-218(b) can be individually biased with biasing elements (not shown) that may be formed in or on semiconductor substrate 206. The biasing elements may bias the charge control electrodes 212(a)-212(b), 214(a)-214(b), 216(a)-216(b), 218(a)-218(b) at potentials that are different from metal layer 202 and/or semiconductor substrate 206. Any suitable biasing element could be used to bias the charge control electrodes. For example, the biasing elements can be resistors with different resistance values in a voltage divider. Alternatively, the biasing elements could be a series of diodes with different voltage ratings. Examples of suitable diodes can be found in U.S. Pat. No. 5,079,608, which is herein incorporated by reference in its entirety. In some embodiments, the biasing elements may be coupled to metal layer 202. For example, metal layer 202 could be tapped with the biasing elements to provide charge control electrodes 212(a)-212(b), 214(a)-214(b), 216(a)-216(b), 218(a)-218(b) with appropriate bias voltages. The biasing elements could also be coupled to the substrate 206.

The biased charge control electrodes 212(a)-212(b), 214(a)-214(b), 216(a)-216(b), 218(a)-218(b) in each trench 210(a)-210(b) are used to advantageously alter the electrical field within the semiconductor region 204. When the Schottky diode structure 200 is in the blocking state (i.e., reverse biased), the biased charge control electrodes 212(a)-212(b), 214(a)-214(b), 216(a)-216(b), 218(a)-218(b) alter the electrical field within the semiconductor region 204 so that the resulting electrical field profile in semiconductor region 204 is higher and more uniform than if no charge control means were present in semiconductor region 204. In one embodiment, biased charge control electrodes 212(a)-212(b), 214(a)-214(b), 216(a)-216(b), 218(a)-218(b) alter the electrical field within semiconductor region 204 so that the electrical field is high and is substantially uniform throughout a substantial portion of semiconductor region 204 or at least in the zones where current flows through semiconductor region 204 from metal layer 202 to substrate 206.

Further, by properly biasing the charge control electrodes and selecting proper thickness for dielectric material 208, the charge spreading in semiconductor region 204 can be improved. In one embodiment, the charge control electrodes are connected to ground potential or to the anode potential and the dielectric thickness on each electrode is adjusted to achieve optimum charge balance in semiconductor region 204. In an alternate embodiment, an optimum uniform thickness is selected for dielectric material 208, and the electrodes in each trench are biased to appropriate potentials to achieve charge balance. In yet another embodiment, both the thickness of the dielectric material on each electrode and the potential of each electrode are independently adjusted to achieve optimum charge balance.

Figure 3:
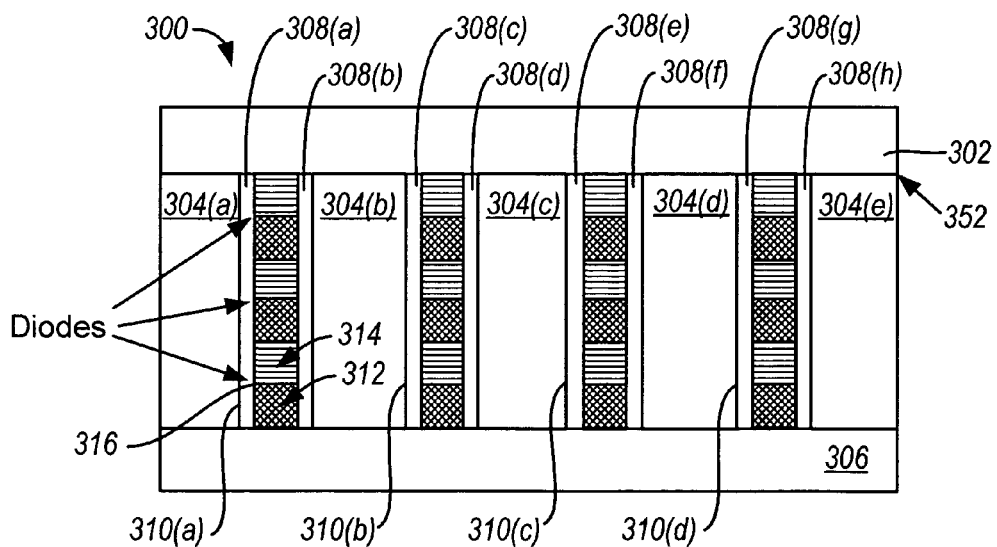
FIG. 3 shows a cross-section view of a Schottky diode having trenches with diodes therein in accordance with another embodiment of the present invention.

FIG. 3 shows a cross-section view of a Schottky diode structure 300 having a plurality of trenches 310(a)-310(d) in accordance with another embodiment of the present invention. A semiconductor region 304 (e.g., an epitaxial layer), is formed over and is of the same conductivity type as a substrate 306. Semiconductor region 304 forms a Schottky barrier with metal layer 302. A plurality of trenches 310(a)-310(d) extends from a top surface of the semiconductor region 304 to substrate 306. Trenches 310(a)-310(d) may alternatively be terminated at a shallower depth or could extend deeper into substrate 306.

Trenches 310(a)-310(d) include diodes made up of opposite conductivity type regions 312 and 314 forming a pn junction 316 therebetween. Doped polysilicon or n-type and p-type silicon may be used to form regions 312 and 314. Other material suitable for forming such trench diodes (e.g., Silicon Carbide, Gallium Arsenide, Silicon Germanium) may also be used. The trench diodes are insulated from semiconductor region 304 by insulating material 308(a)-308(h) extending along the sidewalls of trenches 310(a)-310(d). Oxide may be used as insulating material 308(a)-308(h). As shown in FIG. 3, there is no insulating material along the bottom of trenches 310(a)-310(d) thus allowing the bottom region 312 of the bottom trench diode to be in electrical contact with the underlying substrate 306. The thickness of insulating material 308(a)-308(h), in one embodiment, is determined by such factors as the voltage that insulating material 308(a)-308(h) is required to sustain and the extent to which the electric field in the trench diode is to be induced in semiconductor region 304(a)-304(e) (i.e., the extent of coupling through the insulating layer).

Although four trenches 310(a)-310(d) are shown in FIG. 3, it is to be understood that any suitable number of trenches can be, and typically many more trenches are, present in the semiconductor structure. Also, although three diodes are shown in each of trenches 310(a)-310(d) in FIG. 3, it is to be understood that any suitable number of diodes can be present in each trench.

When Schottky diode 300 is reverse biased, the diodes embedded in trenches 310(a)-(d) are reverse biased and thus the electric field is higher at the diode junctions 316 in the trenches. Through insulating layer 308(a)-(h), the electric field in the trench diodes induces a corresponding electric field in regions 304(a)-304(e). The induced field is manifested in regions 304(a)-304(e) in the form of up-swing spikes and a general increase in the electric field curve in regions 304(a)-304(e). This results in an electric field curve which tapers down from its highest level at the major surface 352 at a far lower rate than in conventional structures. A trapezoidal-shaped area can thus be obtained under the electric field curve in regions 304(a)-304(e) as opposed to the conventional triangular shape. A far greater breakdown voltage is thus obtained.

When Schottky diode structure 300 is biased in the conduction state, current passes through regions 304(a)-304(e). The electric filed across the reverse-biased trench diodes influence the charge distribution in regions 304(a)-304(e) such that a more uniform charge spreading is obtained in regions 304(a)-304(e). That is, the amount of charge remains relatively uniform across regions 304(a)-304(e). By spreading the charge more uniformly in regions 304(a)-304(e), the silicon area taken up by regions 304(a)-304(e) is more efficiently used. Hence, for the same size regions 304(a)-304(e), the portion of the device on-resistance attributable to regions 304(a)-304(e) is, in effect, reduced. This enables reducing the cell pitch for the same on-resistance. Generally, reverse biasing of the trench diodes can be achieved by connecting any of the N-type regions in the diode trenches to a high potential, or alternatively connecting any of the P-type regions in the trenches to a low potential.

Accordingly, trenches 310(a)-(d) enable optimizing structure 300 to have higher breakdown voltage, lower on-resistance, and smaller cell pitch than can be achieved by conventional techniques.

Figure 4A:
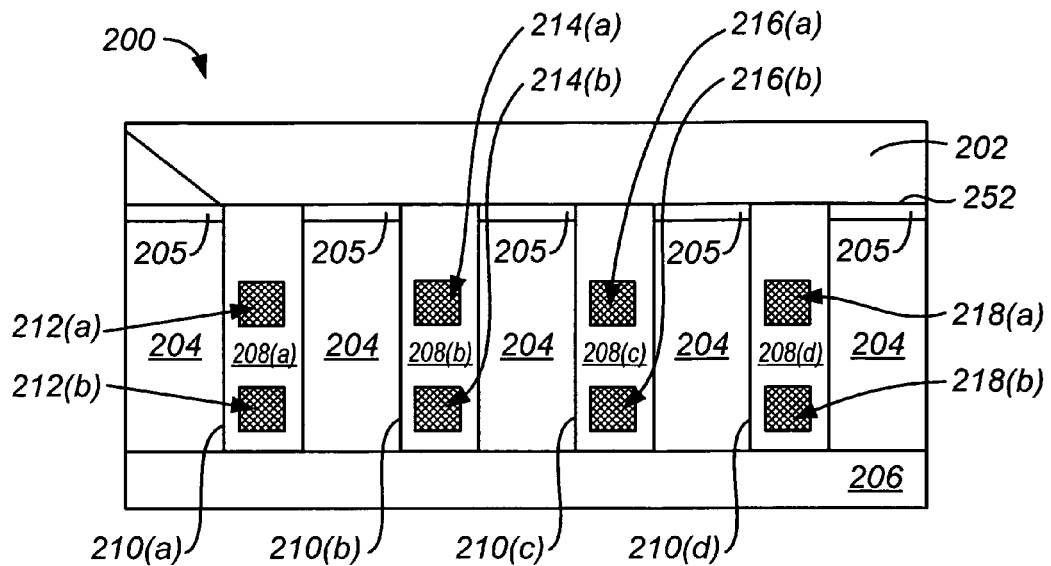
FIGS. 4A and 4B respectively show a variation of the Schottky diode embodiments in FIGS. 2 and 3.
Figure 4B:
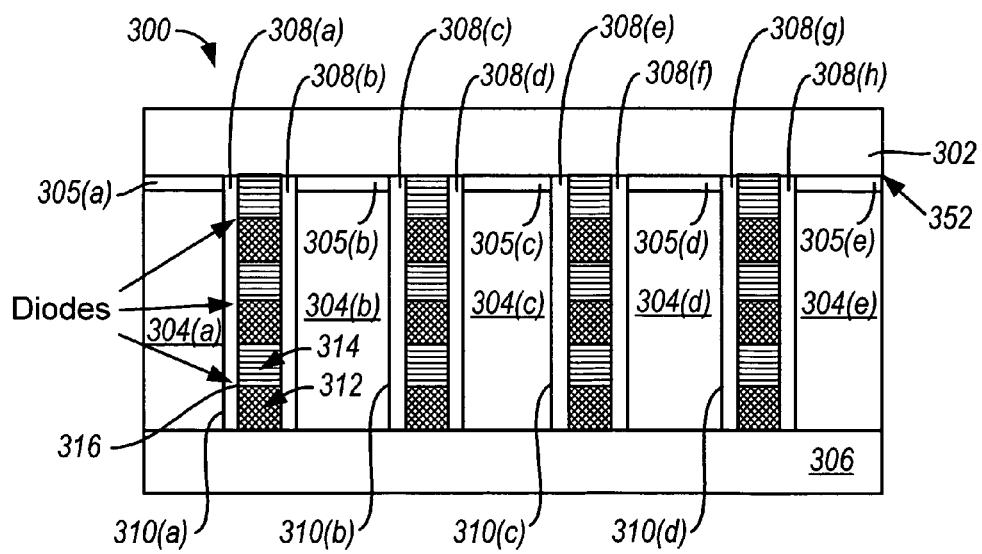

FIGS. 4A and 4B show a variation of the Schottky diode embodiments in FIGS. 2 and 3, respectively. In FIG. 4A, lightly-doped shallow regions 205 are formed at an upper surface area of semiconductor region 204 between adjacent trenches 210. Shallow regions 205 have the same conductivity type as but lower doping concentration than semiconductor region 204. Shallow regions 205 may be formed using conventional techniques such as implanting sufficient counter-dopants at the surface area to reduce the doping concentration at the silicon to metal interface to less than that of semiconductor region 204. In one embodiment, shallow regions 205 have a depth of in the range of 0.1-0.5 μm.

Lightly-doped shallow regions 205 increase the barrier height at the Schottky junction thus advantageously minimizing the leakage current during the device blocking state. This in turn allows a higher doping concentration to be used in semiconductor region 204 thus reducing the diode on-resistance without degrading the blocking capability of the diode. FIG. 4B shows similarly integrated lightly-doped shallow regions 305 in the Schottky diode embodiment of FIG. 3.

Referring to FIG. 2, each of the charge control electrodes in each trench induces an electric filed increase in the corresponding area of adjacent semiconductor regions such that a substantially uniform electric field is obtained in the semiconductor regions between adjacent trenches. The net effect of the electric field increase caused by each charge control electrode is that the conventional triangular-shaped electric field in the semiconductor region is changed to a trapezoidal-shape. Thus, the area under the electric field curve is increased resulting in a higher breakdown voltage. With each charge control electrode causing a local increase in the electric field in corresponding adjacent semiconductor regions, the top of the electric field waveform has a saw-tooth or saddled appearance. By using more charge control electrodes in each trench, the top of the electric field waveform could be made flatter and less saddled.

Figure 5:
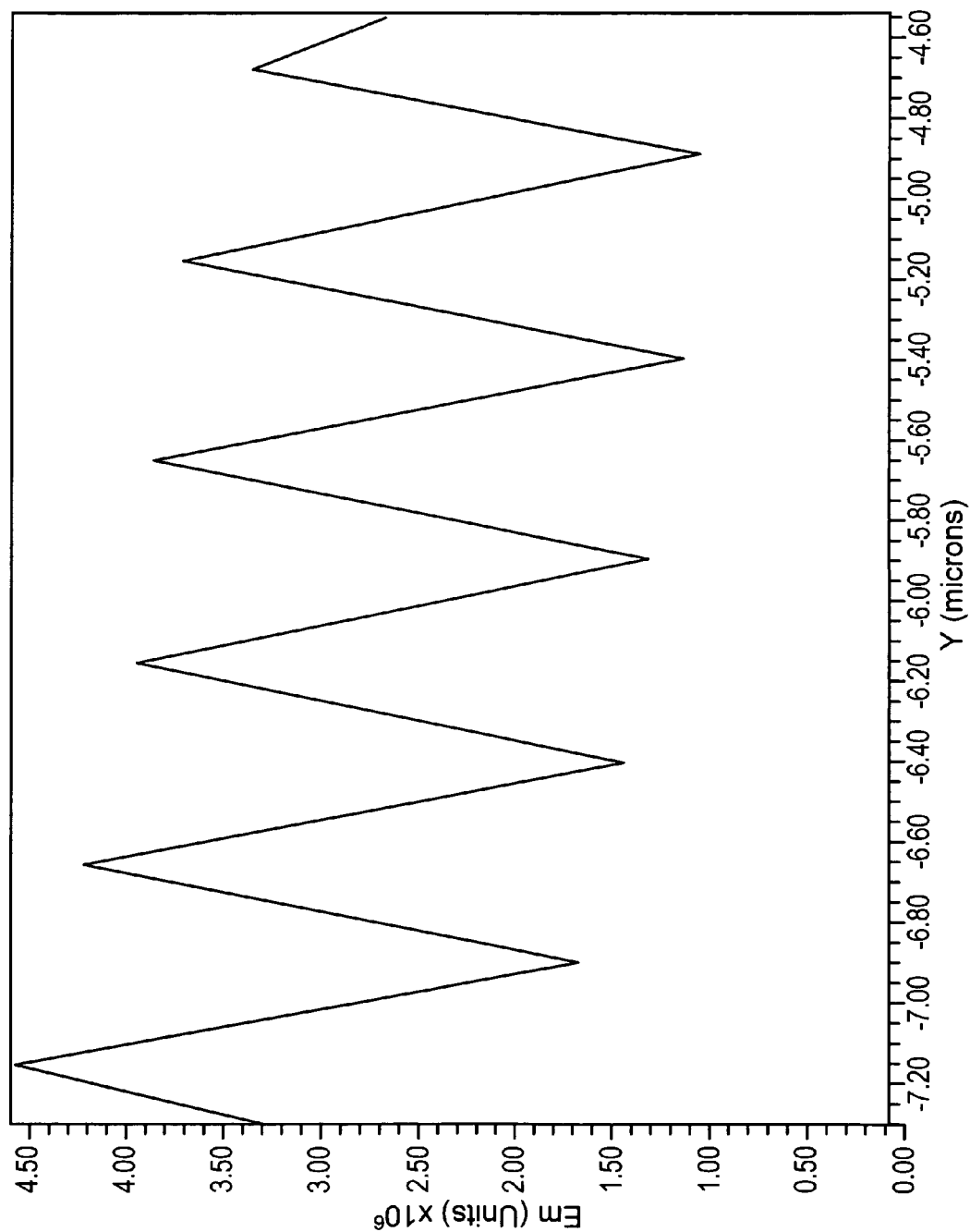
FIGS. 5 and 6 are graphs respectively showing the electric field through diode trenches and the semiconductor regions between adjacent trenches of an exemplary embodiment of the FIG. 3 Schottky diode structure.
Figure 6:
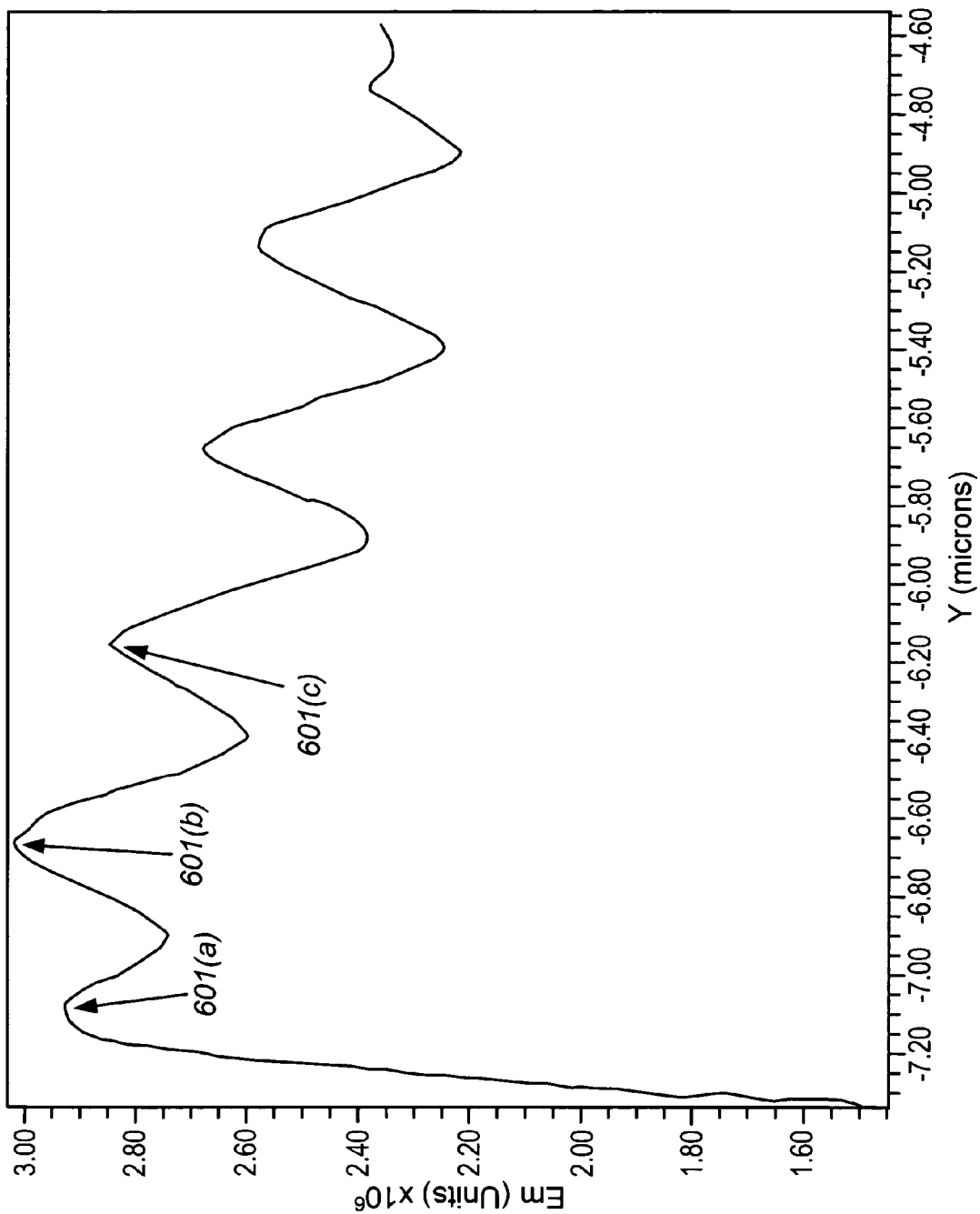

Illustratively, FIGS. 5 and 6 show the electric field curve through diode trenches 310a,b,c,d (FIG. 3) and through semiconductor regions 304a,b,c,d,e, respectively. The vertical axis in FIGS. 5 and 6 represents electric field and the horizontal axis represents dimension. In FIG. 5, the horizontal axis from left to right corresponds to the vertical dimension through the diode trench from top to bottom. In FIG. 6, the horizontal axis from left to right corresponds to the vertical dimension from the top surface 352 through the semiconductor regions 304a,b,c,d,e to the substrate 306.

As shown in the FIG. 5 graph, the reverse-bias across the trench diodes results in an electric field peak at each diode junction. Each of these electric field peaks induces a corresponding electric filed increase in a corresponding area of the adjacent semiconductor region as shown in the FIG. 6 graph. An almost trapezoidal-shaped area under the electric field curve is thus obtained, which is substantially greater than the area under the triangular-shaped electric field curve for conventional diode structures. Thus, a substantial increase in the breakdown voltage is achieved. The larger the number of diodes embedded in the trench, the greater would be the number of peaks in the electric filed in semiconductor regions 304a,b,c,d,e, and thus the higher would be the area under the curve. The higher breakdown voltage enables the doping concentration of semiconductor region 304 (conventionally kept low to obtain the necessary breakdown voltage) to be increased to reduce the on-resistance.

The following table sets forth the values used for some of the simulation parameters. These values are merely exemplary and not intended to be limiting.

| Parameter | Value |
| --- | --- |
| Epi doping | $2 \times 10^{15}$ cm$^{-3}$ |
| Diode doping (N-type and P-type) | $1 \times 10^{16}$ cm$^{-3}$ |
| Thickness of each of the N-type and P-type regions in diode trenches | 0.5 μm |
| Thickness of oxide along trench sidewalls | 500 Å |
| Thickness of gate oxide | 500 Å |

Figure 7A:
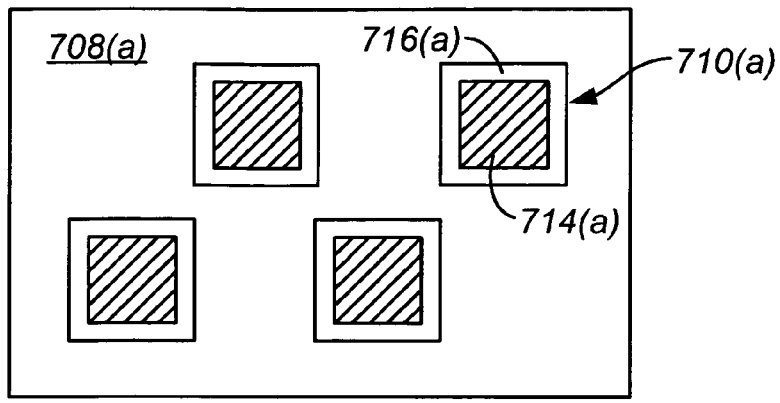
FIGS. 7A-7C show top views of three exemplary layout designs of the structures shown in FIGS. 2 or 3.
Figure 7B:
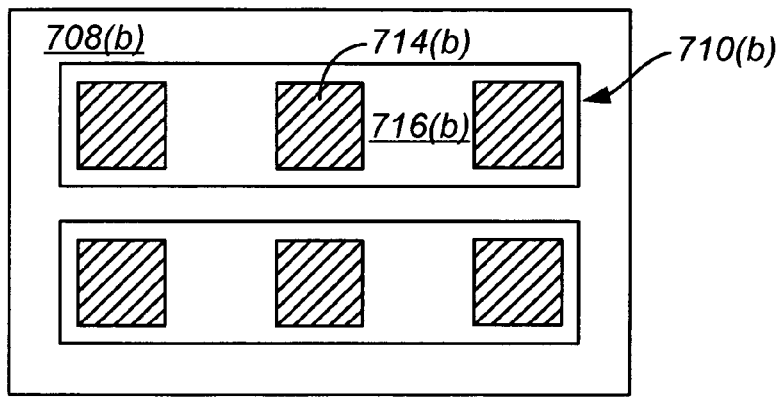
Figure 7C:
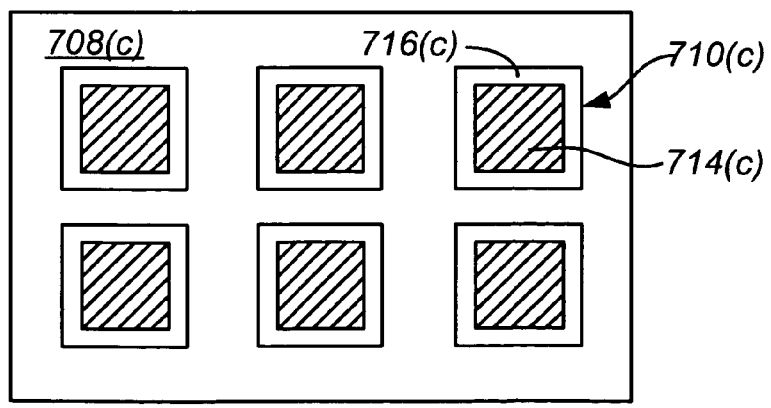

In embodiments with trench diodes or charge control electrodes, spacings and trench arrangement can be implemented in various stripe or cellular designs. A top view of three exemplary layout designs are shown in FIGS. 7A, 7B, and 7C. In FIG. 7A, trenches 710(a) are offset from one another, while FIG. 7B shows trenches 710(b) to be aligned and arranged along rows and columns. In FIG. 7C, horizontally-extending trenches 710(c) are arranged as parallel stripes. Diode or electrode regions 714(b) insulated from one another by insulating material 716(b) are laterally spaced from each other in each trench stripe 710(b). Although the trench regions and the diodes or electrodes embedded therein are shown as square or rectangular shaped regions, they may be designed as circular, oval, hexagonal, or any other geometric shape that is desired. Thus, many different designs, configurations, and geometric shapes can be envisioned by one skilled in the art in light of this disclosure.

Other embodiments of the invention are directed to methods for forming Schottky diodes with charge control electrodes and trench diodes. Exemplary method embodiments for forming stacked charge control electrodes within a trench in a semiconductor substrate are described next with reference to FIGS. 8A to 8I.

Figure 8A:
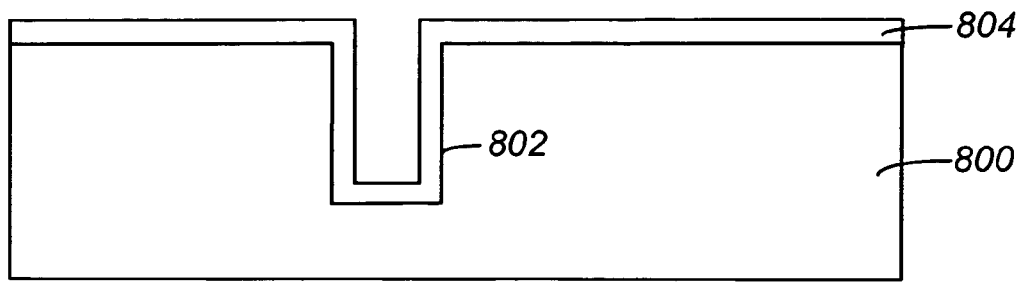
FIGS. 8A-8I show cross-section views at different processing stages of forming a Schottky diode structure having trenches with stacked charge control electrodes therein in accordance with an embodiment of the invention.

In FIG. 8A, a trench 802 is etched in a semiconductor region 800 using conventional techniques such as an anisotropic etching process. A first oxide layer 804 is then formed to line the trench sidewalls and bottom and extend over the surface of semiconductor region 800. The first oxide layer 802 can be formed by, for example, an oxidation process or deposition process such as chemical vapor deposition (CVD).

Figure 8B:
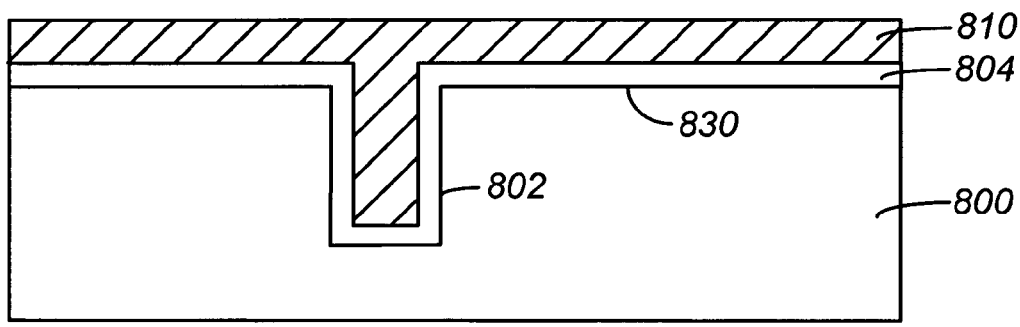
Figure 8C:
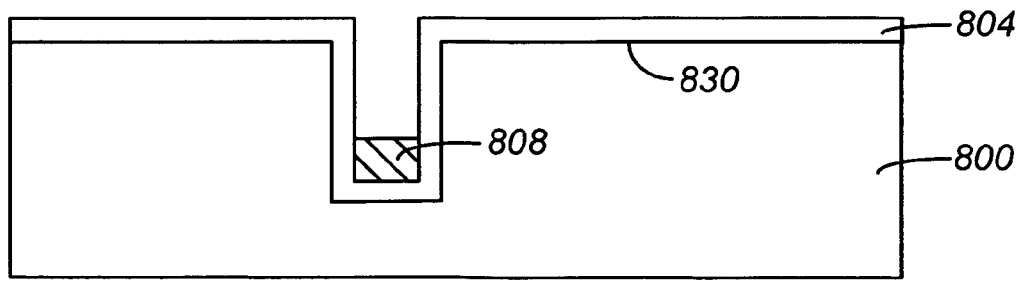

In FIG. 8B, a polysilicon layer 810 is formed to fill trench 802. Next, as shown in FIG. 8C, polysilicon layer 810 is then recessed using conventional polysilicon etching techniques to form a first charge control electrode 808. Polysilicon layer 810 may be etched using, for example, a dry RIE (reactive ion etch) process. The first charge control electrode 808 is disposed well below the major surface 830 of semiconductor region 800 and is buried within the semiconductor region 800.

Figure 8D:
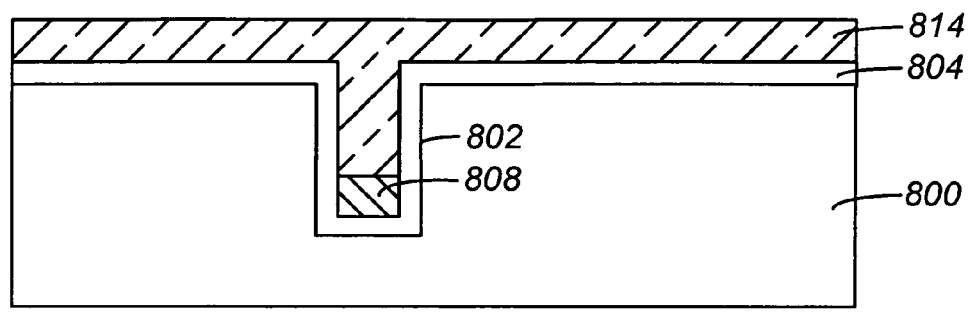

In FIG. 8D, a dielectric material 814 is deposited to fill trench 802. Dielectric material 814 may comprise, for example, glass such as BPSG (borophosphsilicate glass) or BSG (borosilicate glass). If glass is used, the glass can be deposited using, for example, a vapor deposition process with a subsequent reflow step. In the reflow step, the entire structure is heated to flow the glass so that it can fill the empty spaces of trench 802. Alternatively, silicon oxide or silicon nitride could be used as dielectric material 814.

Figure 8E:
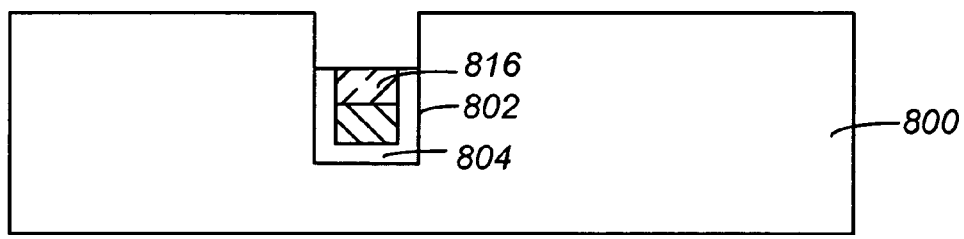

In FIG. 8E, dielectric material 814 is etched with a suitable etchant in another recess etch process such that a dielectric layer 816 remains on the first charge control electrode 808. Dielectric layer 816 can serve as a barrier between the first charge control electrode 808 and a later formed second charge control electrode.

Figure 8F:
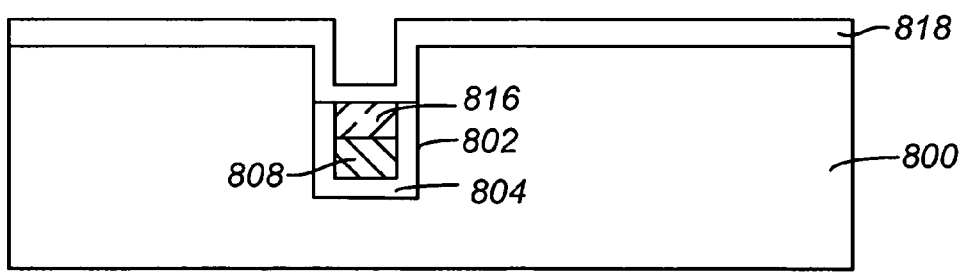
Figure 8G:
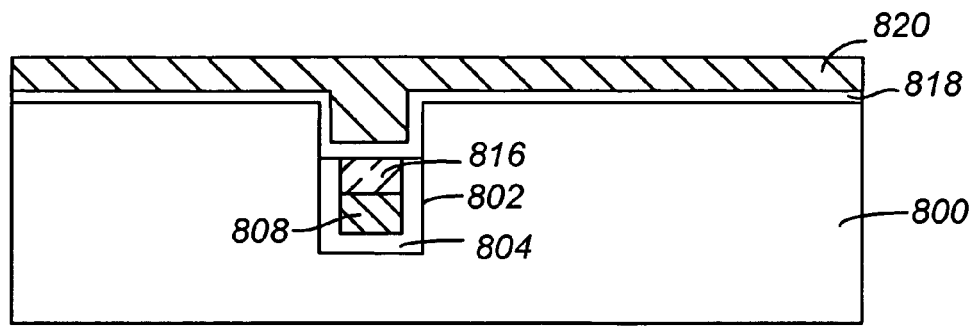

In FIG. 8F, a second oxide layer 818 is formed on the semiconductor region 800. Similar to first oxide layer 804, the second oxide layer 818 can be formed using an oxidation process or a CVD. In FIG. 8G, another polysilicon layer 820 is formed to fill trench 802. Polysilicon layer 820 can be formed in the same or different manner as the previously described polysilicon layer 810.

Figure 8H:
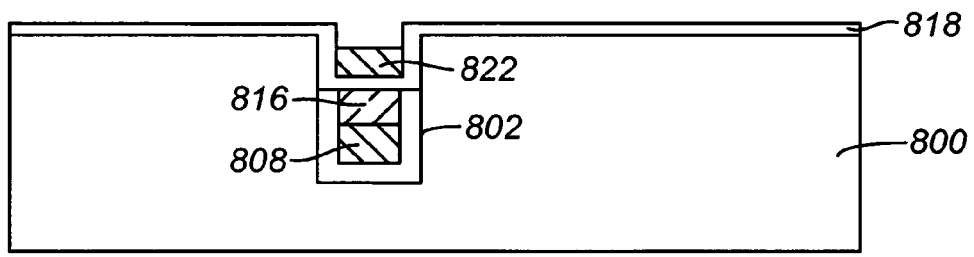

In FIG. 8H, another recess etch process is performed to form a second charge control electrode 822. The second charge control electrode 822 is disposed below the major surface 830 of semiconductor region 800. Both the first and second charge control electrodes 808, 822 are insulated from each other and from semiconductor region 800.

Figure 8I:
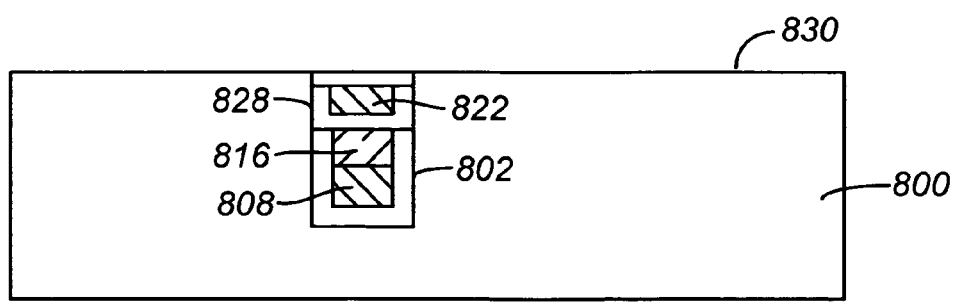

In FIG. 8I, an insulating material fills the trench over the second charge control electrode 822. It is apparent that the general process sequence described herein could be used to form additional charge control electrodes on top of the second charge control electrode 822 or along the sides of the first and second charge control electrodes. The remaining process steps for forming the top metal layer and the other structural features of the Schottky diode are carried out in accordance with conventional techniques and methods. In one embodiment, semiconductor region 800 is an epitaxial layer formed over a substrate (not shown). In the embodiment wherein lightly-doped shallow regions are to be formed at the Schottky interface as shown in FIG. 4A, a conventional counter-dopant implant is carried out after the step depicted by FIG. 8I but before forming the metal layer. The formation of the shallow regions is not limited to this particular stage, and may be carried out at an earlier or later stage of the process.

Figure 9A:
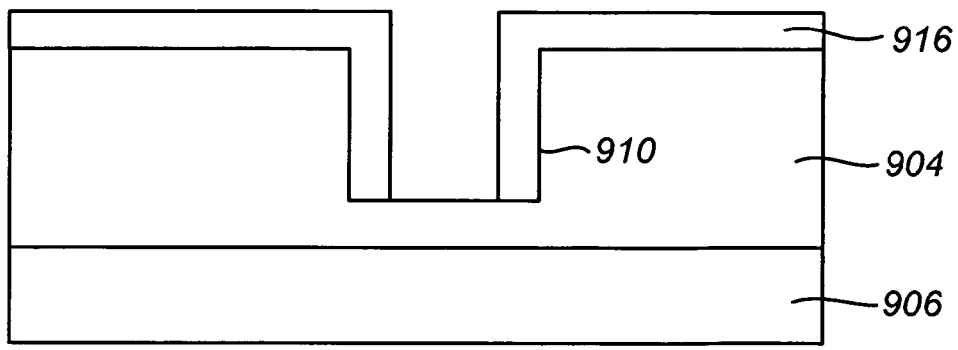
FIGS. 9A-9F show cross-section views at different processing stages of forming a Schottky diode structure having trenches with diodes therein in accordance with another embodiment of the invention.
Figure 9B:
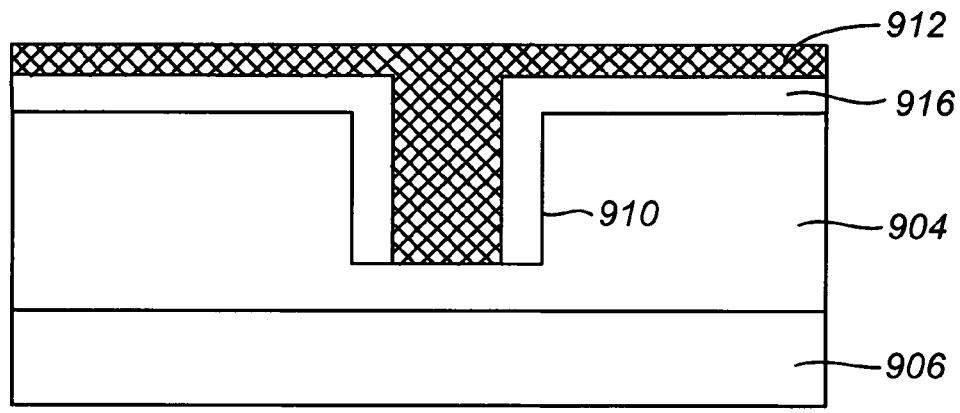

Other embodiments of the invention are directed to methods for forming Schottky diodes with trenches having diodes therein. Exemplary method embodiments for forming diodes within a trench in a semiconductor region are described with reference to FIGS. 9A to 9F. In FIG. 9A, an epitaxial layer 904 is formed over substrate 906 using conventional methods. A trench mask defining a trench opening is then formed by depositing and patterning a photoresist layer (not shown). Silicon is removed from the defined trench opening to form trench 910. The trench surfaces are then cleaned and a thin layer of thermal oxide is grown inside the deep trench. A thicker (e.g. 200-600 nm) insulating layer (e.g., CVD oxide) is then deposited over the thin layer of thermal oxide. The sidewalls of the trench are thus lined with an insulating layer 916. The insulating material along the bottom of the trench is then removed. A suitable spacer material (e.g., nitride) may be used to protect the insulating material along the trench sidewalls during removal of insulation material at the trench bottom.

Figure 9C:
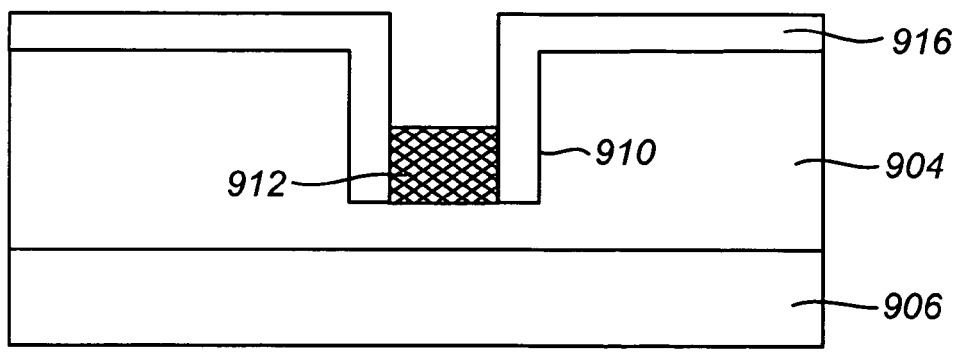
Figure 9D:
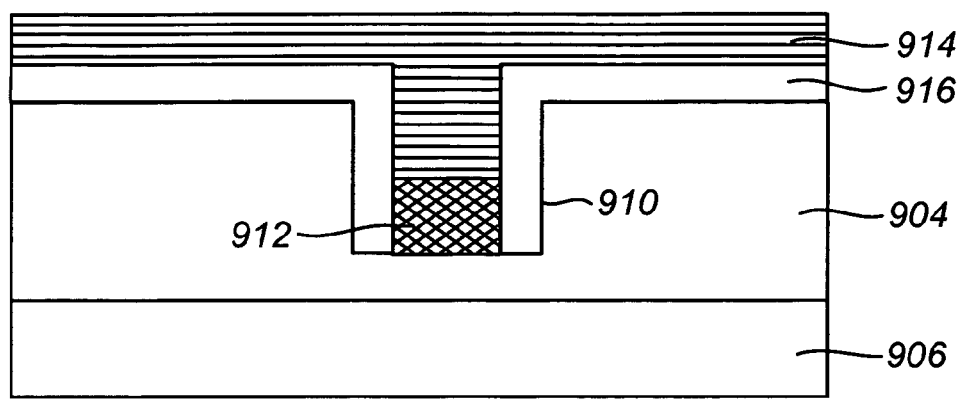
Figure 9E:
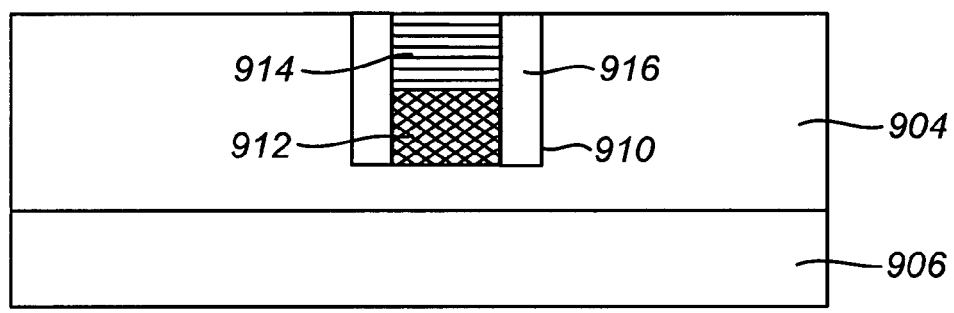

In the embodiment wherein doped polysilicon is used to form the trench diode, as in FIGS. 9B-9E, the diode (made up of regions 912 and 914 of opposite conductivity type) is formed by performing a two step process of polysilicon deposition (FIGS. 9B and 9D) followed by polysilicon etch (FIGS. 9C and 9E). In the embodiment wherein the trench diode is from silicon material, the diode is formed by performing silicon deposition for each diode region using conventional selective epitaxial growth techniques. The steps for forming the diode can be repeated to form additional diodes in the trench. If a large number of stacked polysilicon diodes is required, a cluster tool commonly used to combine the steps of polysilicon deposition and polysilicon etch may be used to speed up the processing time.

Figure 9F:
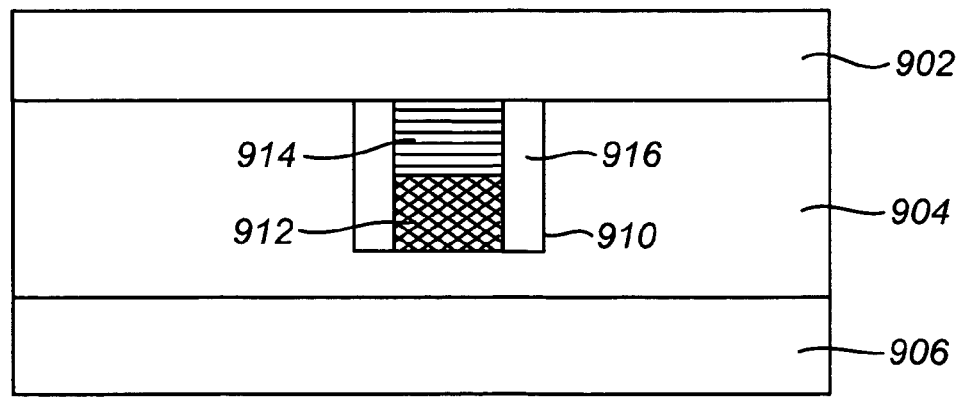

In FIG. 9F, a metal layer 902 is then formed on epitaxial layer 904 using conventional techniques. In the embodiment wherein lightly-doped shallow regions are to be formed at the Schottky interface as shown in FIG. 4B, a conventional counter-dopant implant is carried out before forming the metal layer.

Regions 912 and 914 in trench 910 (FIG. 9F) may be n-type and p-type respectively, or alternatively their conductivity type may be reversed. Also, either of regions 912 and 914 may be independently biased if desired by, for example, extending one or both regions along the third dimension (i.e., perpendicular to the page) and then up to the silicon surface where contact can be made to them. Although only two regions of opposite conductivity is shown in trench 910, three regions forming an npn or pnp stack, or any number of regions of alternating conductivity type may be formed in trench 910. Further, as many trenches as needed may be formed. In one embodiment, substrate 906 and epitaxial layer 904 are of n-type conductivity, and epitaxial layer has a lower doping concentration than substrate 906.

By properly designing the p-type and n-type regions of the trench diode, the trench diode's advantageous impact on charge spreading in the epitaxial layer 904 can be enhanced. Two factors impacting the charge spreading are the avalanche breakdown voltage of the trench diode and the width of the depletion region in the trench diode. For example, by selecting proper doping concentration for each of the p-type and n-type regions of the trench diode, a high avalanche breakdown voltage can be obtained so that a maximum electric field of much greater magnitude than the conventional $2\times10^5$ V/cm can be obtained. The limitation in obtaining the maximum electric field then becomes the ability of insulating layer 916 to withstand high voltages. This limitation can however be eliminated by the proper design of insulating layer 916. Typical gate oxide layers have a maximum electric field exceeding $3.5 \times 10^5$ V/cm which suffices for many high voltage applications.

In alternate embodiments, trench 910 is made deeper to terminate at the interface between epitaxial layer 904 and substrate 906, or alternatively, trench 910 is made yet deeper to extend clear through epitaxial layer 904 terminating within substrate 906.

The cross-section views of the different embodiments may not be to scale, and as such are not intended to limit the possible variations in the layout design of the corresponding structures. Also, even though the Schottky diode embodiments herein are described in the context of vertically conducting structures, the principles of the present invention may be applied to laterally conducting Schottky diode structures. For example, the charge control electrodes could be integrated in lateral Schottky diode structures in a similar manner to those shown in the FIGS. 5 and 6 structures of the above referenced U.S. Pat. No. 6,777,641. Also, the trench structure with diodes therein could be integrated in lateral Schottky diode structures in a similar manner to that shown in the FIG. 7C structure of the above-referenced pending patent application Ser. No. 10/288,982, filed Nov. 5, 2002, entitled "Trench Structure Having One or More Diodes Embedded Therein Adjacent a PN Junction and Method of Forming the Same."

Although a number of specific embodiments are shown and described above, embodiments of the invention are not limited thereto. For example, it is understood that the doping polarities of the structures shown and described could be reversed and/or the doping concentrations of the various elements could be altered without departing from the invention.

While the foregoing is directed to certain preferred embodiments of the present invention, other and further embodiments of the invention may be devised without departing from the basic scope of the invention. Such alternative embodiments are intended to be included within the scope of the present invention. Moreover, the features of one or more embodiments of the invention may be combined with one or more features of other embodiments of the invention without departing from the scope of the invention.

Therefore, the scope of the present invention should be determined not with reference to the above description but should, instead, be determined with reference to the appended claim, along with their full scope of equivalents.

What is claimed is:

1. A method for forming a Schottky diode having a semiconductor region, the method comprising:
   forming a plurality of charge control electrodes in the semiconductor region, wherein at least two of the charge control electrodes are adapted to be biased differently from one another; and
   overlaying the semiconductor region with a metal layer to thereby form a Schottky barrier therebetween, the metal layer being insulated from at least one of the plurality of charge control electrodes, wherein the plurality of charge control electrodes are below the Schottky barrier so as to influence an electric field in the semiconductor region to improve a breakdown voltage of the Schottky diode.

2. The method of claim 1 further comprising forming a plurality of trenches in the semiconductor region, and wherein the step of forming a plurality of charge control electrodes comprises:
   lining each of the plurality of trenches with an insulating layer;
   depositing a first conductive material in each trench and then etching the first deposited conductive material to form a first charge control electrode in each trench;
   forming a first insulating layer over each of the first charge control electrodes;
   depositing a second conductive material in each trench and then etching the second deposited conductive material to form a second charge control electrode in each trench over the first insulating layer.

3. The method of claim 1 further comprising:
   forming a plurality of trenches extending into the semiconductor region, the plurality of charge control electrodes being formed in the plurality of trenches; and
   forming a plurality of shallow regions in a top surface region of the semiconductor region between adjacent pairs of the plurality of trenches such that the metal layer is in direct contact with the shallow regions, the shallow regions having the same conductivity type as but a lower doping concentration than that of the semiconductor region.

4. The method of claim 3 further comprising forming the plurality of charge control electrodes in the plurality of trenches such that the plurality of charge control electrodes are insulated from one another and from the semiconductor region.

5. The method of claim 3 wherein the semiconductor region and the shallow layer are n-type.

6. The method of claim 1 wherein the method further comprises forming a plurality of biasing elements on or in the semiconductor region, wherein the biasing elements are adapted to bias the at least two charge control electrodes at different voltages.

7. The method of claim 1 wherein the first and second charge control electrodes comprise polysilicon.

8. A method of forming a Schottky diode, comprising:
   forming a first trench extending in a semiconductor region; and
   forming at least one diode in the first trench; and
   overlaying the semiconductor region with a metal layer to thereby form a Schottky barrier therebetween, the metal layer also extending over the first trench, wherein no current flows through the first trench when the Schottky diode is in a conducting state, and wherein the at least one diode influences an electric field in the semiconductor region to thereby increase a blocking voltage of the Schottky diode.

9. The method of claim 8 further comprising:
   forming an insulating layer which extends along sidewalls of the first trench but is discontinuous along the bottom of the first trench.

10. The method of claim 8 further comprising:
    forming an insulating layer configured to insulate the at least one diode from the semiconductor region along the sidewalls of the first trench.

11. The method of claim 8 wherein the semiconductor region is an epitaxial layer, the method further comprising:
    forming the epitaxial layer over and in contact with a substrate, the epitaxial layer being of the same conductivity type as the substrate.

12. The method of claim 8 wherein the at least one diode is arranged in the first trench so that when the Schottky diode is biased in a blocking state an electric field induced in the at least one diode influences an electric field in the semiconductor region to thereby increase the blocking voltage of the Schottky diode.

13. The Schottky diode of claim 8 wherein the at least one diode is arranged in the first trench so that when the Schottky diode is biased in a blocking state an electric field induced in the at least one diode results in a more uniform charge distribution in the semiconductor region.

14. The method of claim 8 wherein the step of forming at least one diode comprises forming n-type and p-type regions alternately stacked on top of one another in the first trench.

15. The method of claim 8 further comprising:
forming a plurality of shallow regions in a top surface region of the semiconductor region between adjacent pairs of the plurality of trenches such that the metal layer is in direct contact with the shallow regions to form a Schottky barrier therebetween, the shallow layer having the same conductivity type as but a lower doping concentration than that of the semiconductor region.

16. The method of claim 15 wherein the semiconductor region and the shallow layer are n-type.

17. The method of claim 8 wherein the at least one diode is from one of doped silicon material and doped polysilicon material.

18. A method of forming a Schottky diode, comprising:
forming a plurality of laterally spaced trenches in a semiconductor region, each trench extending through at least a portion of the semiconductor region;
forming a plurality of diodes in each of the plurality of trenches; and
overlaying the semiconductor region with a metal layer so as to form a Schottky barrier therebetween, the metal layer extending over the plurality of laterally spaced trenches, wherein no current flows through the plurality of laterally spaced trenches when the Schottky diode is in a conducting state, and wherein the plurality of diodes influence an electric field in the semiconductor region to thereby increase a blocking voltage of the Schottky diode.

19. The method of claim 18 wherein the plurality of diodes are formed in each of the plurality of trenches such that an electric field induced in one or more of the plurality of diodes influences an electric field in the semiconductor region such that a blocking voltage of the Schottky diode is increased.

20. The method of claim 18 further comprising:
forming an insulating layer in each of the plurality of trenches, the insulating layer extending along the trench sidewalls but being discontinuous along the bottom of the trench.

21. The method of claim 18 further comprising:
forming at least two terminals located along opposite surfaces of the Schottky diode, the plurality of trenches extending vertically between the two terminals,
wherein the step of forming a plurality of diodes comprises forming p-type and n-type regions alternately stacked on top of each other in each trench.

22. The method of claim 18 further comprising:
before forming the plurality of trenches, forming a shallow layer along an upper surface of the semiconductor region, the shallow layer having the same conductivity type as but a lower doping concentration than that of the semiconductor region, the plurality of trenches extending through the shallow layer and into the semiconductor region such that the shallow layer is broken up into a plurality of shallow regions between adjacent trenches, wherein the metal layer is in direct contact with the plurality of shallow regions to form a Schottky barrier therebetween.

* * * * *